(12) United States Patent
Davis et al.

(10) Patent No.: US 7,902,927 B2
(45) Date of Patent: Mar. 8, 2011

(54) SYSTEM AND METHOD FOR MODULATING PRESSURE IN AN ALKALI-VAPOR CELL

(75) Inventors: Timothy Davis, Columbus, NJ (US); Sterling McBride, Princeton, NJ (US); Alan Braun, Lawrenceville, NJ (US); William Happer, Princeton, NJ (US)

(73) Assignee: SRI International, Menlo Park, CA (US)

( * ) Notice: Subject to any disclaimer, the term of this patent is extended or adjusted under 35 U.S.C. 154(b) by 75 days.

(21) Appl. No.: 12/487,400

(22) Filed: Jun. 18, 2009

(65) Prior Publication Data

US 2010/0026394 A1 Feb. 4, 2010

Related U.S. Application Data

(60) Provisional application No. 61/073,549, filed on Jun. 18, 2008.

(51) Int. Cl.
*H03L 7/26* (2006.01)
*H03L 1/02* (2006.01)
*H03B 17/00* (2006.01)

(52) U.S. Cl. .............. 331/3; 331/94.1; 331/176
(58) Field of Classification Search ............ 331/3, 94.1, 331/176; 356/437; 372/38.01, 38.02, 55, 372/56, 59, 68, 72, 97
See application file for complete search history.

(56) References Cited

U.S. PATENT DOCUMENTS

| | | | |
|---|---|---|---|
| 4,494,085 A * | 1/1985 | Goldberg | 331/94.1 |
| 6,710,663 B1 * | 3/2004 | Berquist | 331/3 |
| 7,400,207 B2 | 7/2008 | Lipp et al. | |
| 7,508,521 B2 * | 3/2009 | Liu et al. | 356/437 |
| 2006/0022761 A1 | 2/2006 | Abeles et al. | |

* cited by examiner

*Primary Examiner* — Robert Pascal
*Assistant Examiner* — Levi Gannon
(74) *Attorney, Agent, or Firm* — Lowenstein Sandler PC

(57) ABSTRACT

The present invention provides a system and method for achieving a calibration-free primary atomic clock standard operating at the 0-0 transition free-atom frequency, thus creating a primary frequency standard, with attributes that include scalable to chip-scale dimensions and power consumption.

15 Claims, 5 Drawing Sheets

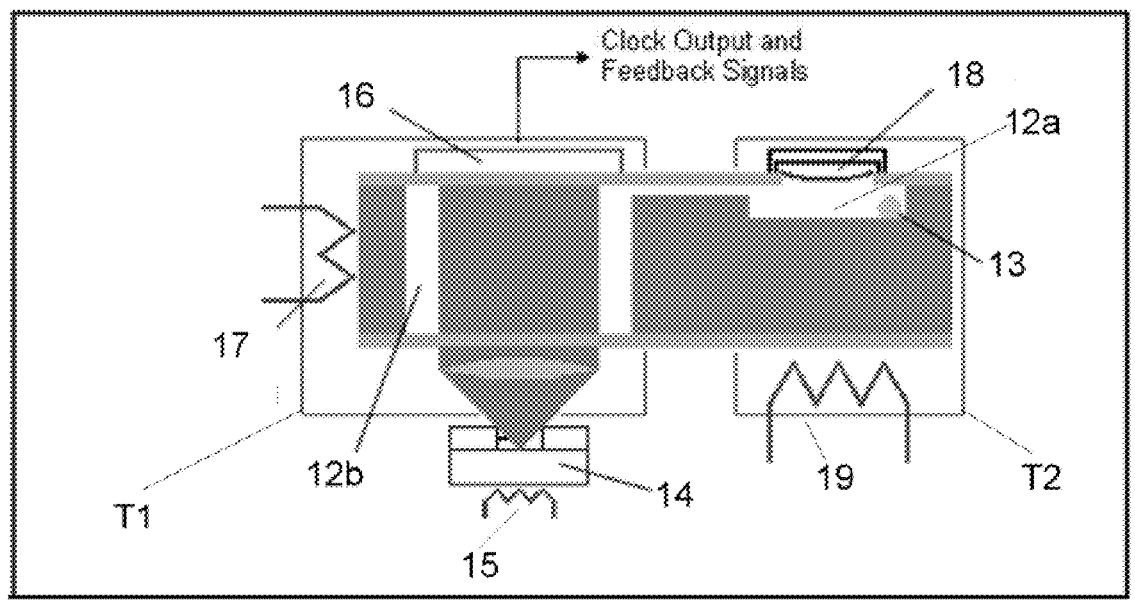
FIG. 3A
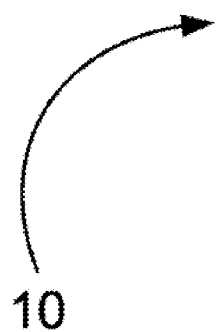

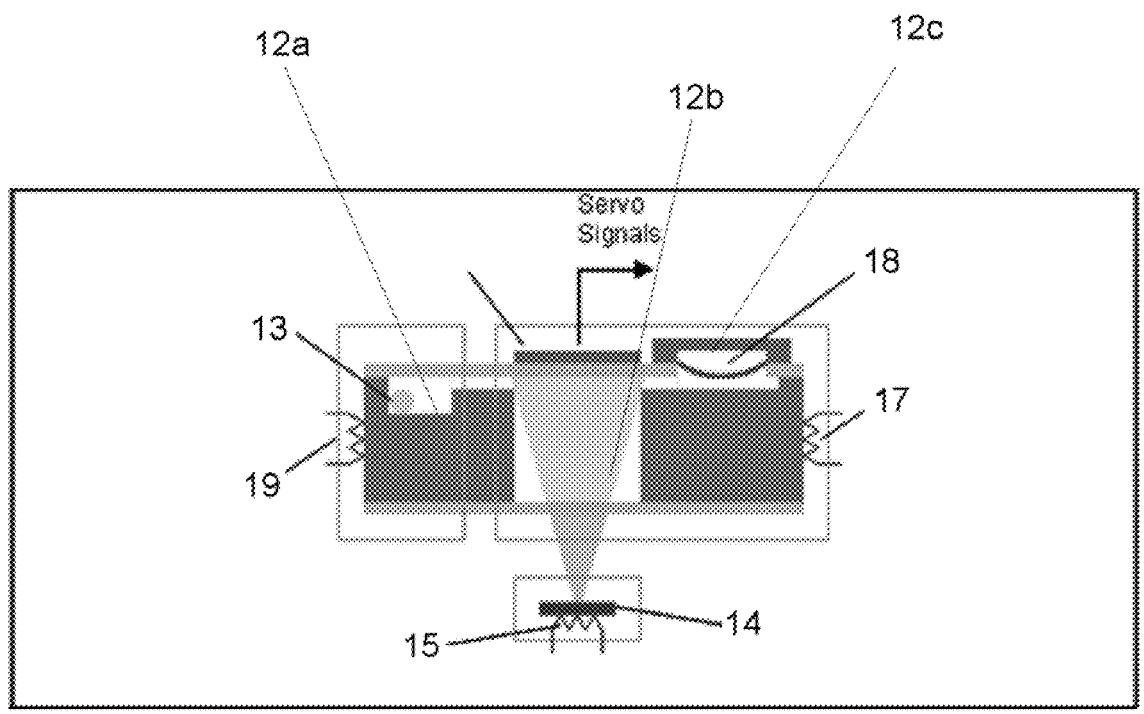
FIG. 3B
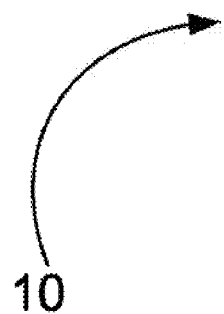

SYSTEM AND METHOD FOR MODULATING PRESSURE IN AN ALKALI-VAPOR CELL

RELATED APPLICATIONS

This application claims priority of U.S. Patent Application Ser. No. 60/073,549 filed on Jun. 18, 2008, both entitled "INTEGRATED MEMs DIAPHRAM ALKALI-VAPOR CELL FOR CORRECTION OF BUFFER-GAS INDUCED CLOCK FREQUENCY SHIFTS", the entire disclosure of both is hereby incorporated by reference as if being set forth in its entirety herein.

FIELD OF THE INVENTION

The present invention relates generally to atomic clocks and systems incorporating atomic clocks, more specifically to a system and method for modulating the inherent buffer gas pressure (or density) to create a vapor-cell clock that is a primary frequency standard.

BACKGROUND OF THE INVENTION

Atomic clock technology is well known and mature, with several companies marketing primary and lab-grade "secondary" atomic clocks. A definition of a primary frequency standard is those atomic-based clocks whose output frequency is equal to the free atom frequency, the frequency typically oscillating on the classic "0-0" clock transition without shifts. A working, practical, definition of a primary standard is that class of frequency standards whose output frequency is known without requiring calibration after fabrication and which have minimal long-term drift. Cesium beam clocks are one such technology of primary frequency standards. As opposed to traditional rubidium clocks which utilize buffer-gas vapor cells (and not considered primary standards), cesium beam clocks operate by interrogating a beam of alkali-atoms traveling within a vacuum enclosed Ramsey cavity, eliminating clock perturbations due to buffer-gas and wall collisions and eliminating need for clock calibration after manufacture.

Vapor cell clocks utilize a buffer-gas background to mitigate against alkali-collisions with cell walls, an event that destroys the atomic spin coherence. The buffer gas minimizes the effects of wall collisions and provides for long atom interrogation times. However, the buffer gas species can cause buffer-gas pressure shifts itself to the fundamental clock hyperfine frequency, causing frequency shifts and hence accuracy errors noticeable in clock-to-clock builds as well as frequency aging over time due to long-term changes in buffer-gas composition and pressure over time.

Traditional vapor-cell clocks are therefore not considered primary standards as it is not possible to fabricate each vapor cell in a manufacturing line to contain the exact same number of buffer-gas molecules and mixture. Currently, these clocks are made with known buffer-gas mixtures that result in zero effect on the temperature-induced frequency shift. Such a temperature-invariant buffer-gas mixture yields practical benefits allowing the vapor cell to experience changes in it's temperature without causing clock shift (as changes in the ambient temperature will cause some slight change in cell temperature), but results in a finite pressure-induced 0-0 frequency shift. These vapor-cell clocks are calibrated after manufacture.

Similarly, there is a buffer-gas mixture for operation at the zero pressure-shift point. Such a mixture has a finite residual temperature coefficient, so for practical systems would require exquisite control on the operating temperature of the alkali-vapor cell to prevent clock errors due to changes in the ambient temperature, a feat not readily feasible due to limitations of standard heater/temperature sensor systems.

Thus, there is a need in the art to provide a buffer gas clock, and method for fabricating the same, that operates as a primary frequency standard; i.e., operating at the free-atom frequency with no clock frequency shifts, without long-term frequency drifts and without need for calibration after manufacture.

SUMMARY OF THE INVENTION

One of the embodiments of the present invention includes an integrated system for providing a chip-scale primary frequency standard. The system comprises an alkali vapor cell having at least two chambers having a common buffer-gas. The buffer gas is nominally of the zero-pressure-shift mixture. The system also comprises a heating element positioned in the alkali vapor cell and a pressure modulator bonded to the alkali vapor cell to modulate pressure in the alkali vapor cell causing a change in frequency shift. The system further comprises a feedback control loop for detecting the change in frequency shift in the alkali vapor cell and providing a signal to the heating element to modify temperature of the alkali vapor cell to compensate for the change in frequency shift so as to maintain the buffer-gas mixture at a zero pressure-shift point.

Further embodiments include a device such as a global positioning (GPS)
device or a GPS-denied device having an input coupled to the integrated system and being operatively responsive to the input.

BRIEF DESCRIPTION OF THE FIGURES

Understanding of the present invention will be facilitated by consideration of the following detailed description of the preferred embodiments of the present invention taken in conjunction with the accompanying drawings, wherein like numerals refer to like parts and:

FIG. 3A illustrates a schematic of an integrated system for providing a chip-scale primary frequency standard in accordance with one embodiment of the present invention.

FIG. 3B illustrates a schematic of an integrated system 20 for providing a chip-scale primary frequency standard in accordance with another embodiment of the present invention.

DETAILED DESCRIPTION OF THE INVENTION

The present invention provides a system and method for achieving a vapor-cell-based calibration-free primary atomic clock standard operating at the free-atom frequency (on the 0-0 transition hyperfine frequency), thus creating a primary frequency standard, with attributes that include scalable to chip-scale dimensions of preferably less than 10 cc and power consumption of preferably 100 mW or less. The system utilizes the benefits of buffer-gas vapor cells, yet actively measures and nulls any clock frequency shift due to buffer-gas pressure shifts. Specifically, the system operates with a buffer-gas mixture nominally at the zero pressure-shift mixture and integrates a device to actively modulate the density of the buffer gas. This pressure modulation is detected as a clock frequency modulation around the zero pressure-shift point, detected on the clock frequency output, and within a feedback loop is used to control the vapor-cell operating temperature, actively maintaining the buffer-gas mixture at the zero pressure-shift point. Hence the system yields a vapor-cell clock that is a primary frequency standard and allows to actively maintain the vapor-cell at the zero-pressure shift point even under gas diffusion and aging. The details of the system and the method are described herein below.

Figure 1:
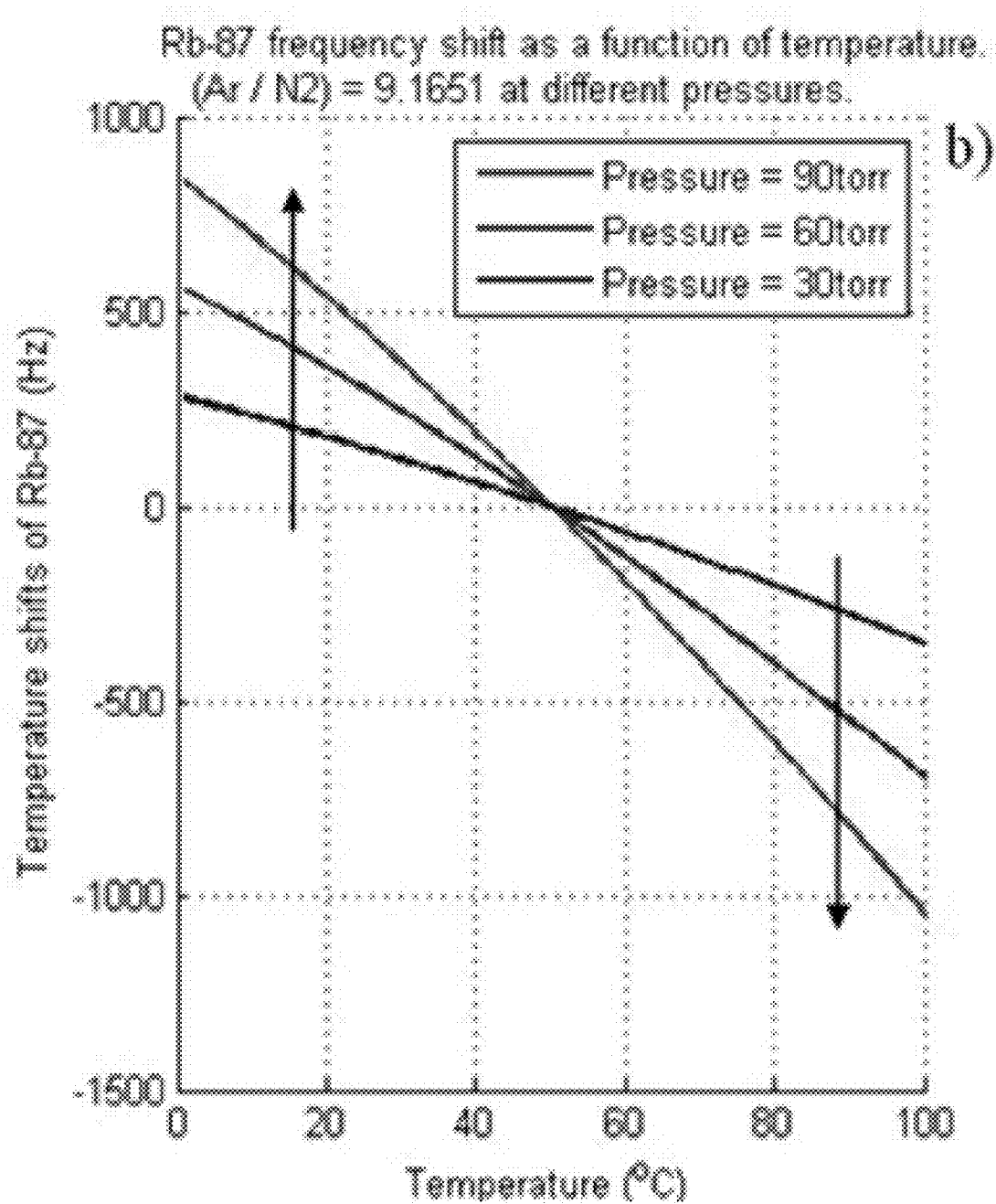
FIG 1 illustrates a graphical representation illustrating frequency shift with respect to pressure and temperature in a typical rubidium cell.

FIG. 1 illustrates a graphical representation of a frequency shift with respect, to temperature and pressure in a typical rubidium (Rb) cell with an Ar:$N_2$ buffer gas mixture of ratio 9.16 (~90% Ar) operating with zero pressure-shift. As can be seen in the graph, even though operating with zero pressure shift, the clock frequency will deviate from the free-atom frequency with temperature, an effect that will cause frequency drifts and is difficult to overcome by use of independent temperature control. From the frequency response of the pressure and temperature as shown in FIG. 3, when cell temperature is low, increasing pressure increases the clock frequency and vice versa. Such a response is ideal for active feedback control for isothermally modulating the cell pressure to allow detection of an error signal caused by pressure-induced clock frequency shift. The systems with the feedback controls as will be described below (with reference to FIGS. 3A, 3B and 4), utilizes this error-signal to adjust the cell temperature to precisely the zero pressure-shift coefficient as shown in the graph of FIG. 2 as described hereinbelow.

Figure 2:
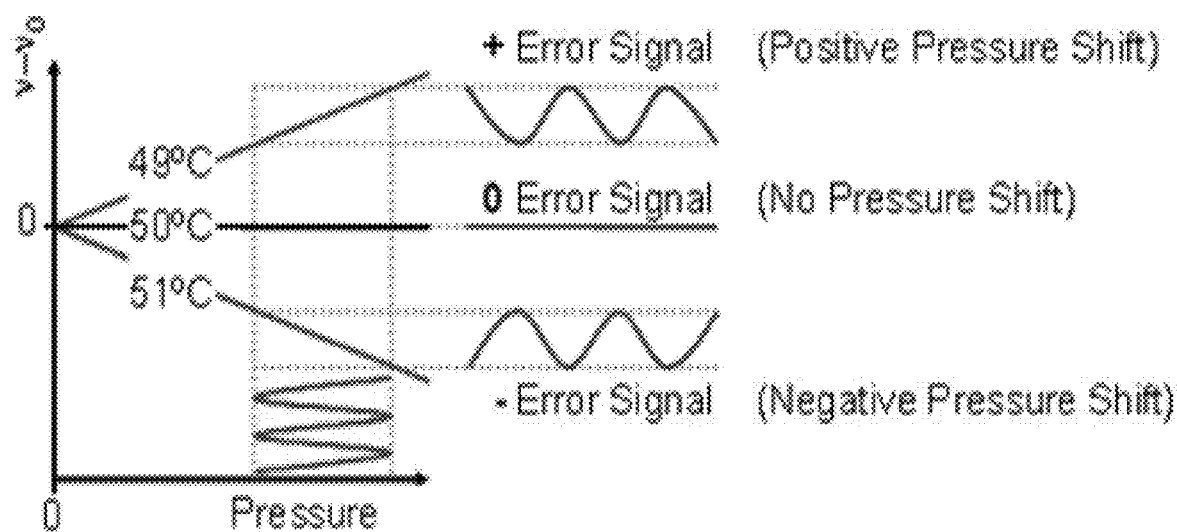
FIG. 2 illustrates a graphical representation illustrating buffer gas pressure shift with respect to temperature in accordance with the present invention.

FIG. 2 illustrates a graphical representation of the buffer gas pressure shift with the change in temperatures in an alkali vapor cell in accordance with the present invention. As indicated in the graph of FIG. 2, when the temperature of the cell is at 50 degrees C., there is zero pressure shift. Due to many factors as discussed above, there will be a shift in the pressure with the change in the temperature. As illustrated, due to a slight decrease in temperature from 50 degrees C. to 49 degrees C. will cause a positive error signal i.e. a positive pressure shift, and due to slight increase in temperature from 50 degrees C. to 51 degrees C. will cause a negative error signal i.e. a negative pressure shift. Pressure modulation as discussed above allows for phase-sensitive error-signal feedback to control the system by adjusting the temperature of the cell to always maintain at a zero pressure-shift point. Pressure modulation frequencies will be low, perferably in the order of 0.1 Hz to 1 Hz, to keep the pressure-change cycle isothermal. Note that the temperatures provided in FIG. 2 are for reference only, and correct buffer-gas mixture can be designed for any desired operating temperature.

FIG. 3A illustrates a schematic of an integrated system 10 for providing a chip-scale primary frequency standard in accordance with the embodiment of the present invention. FIG. 3A illustrates a schematic of the system 10 with needed feedback loops to maintain constant alkali metal density, precise laser wavelength at the zero light shift point, and buffer-gas at the zero pressure shift point. The system 10 includes an alkali vapor cell 12 having at least two chambers commonly known as a source chamber (a.k.a. alkali metal source chamber) 12a comprising an alkali metal 13 and an interrogation chamber 12b. This dual-zone cell is preferably implemented, allowing common buffer-gas atmosphere within the two chambers with alkali-reservoir in the source chamber 12a. Some of the known buffer gas atoms preferably include Ar, Kr, Xe with N2 and the like. Each of these chambers 12a and 12b are maintained at different temperatures, T2 and T1 respectively as illustrated by the rectangular regions surrounding the chambers. The rectangular regions simply illustrate that there two separate temperature control areas controlled by their respective heaters as described in detail below.

The source chamber 12a is held preferably at a temperature lower than the interrogation chamber 12b allowing for maintaining an alkali reservoir away from the optical interrogation cell.

Alkali atoms density 13 is dictated by the temperature of the source chamber, and equilibrates across both chambers through the aperture into interrogation chamber 12b. As known in the art, alkali metals commonly comprise of lithium (Li), sodium (Na), potassium (K), rubidium (Rb), cesium (Cs) and the like. In the preferred embodiment of the present invention, the alkali metal 13 comprises Cs. By changing the temperature of alkali metal chamber, one controls the alkali density within the interrogation chamber. An optimum alkali-density use sought to maximize the clock signal/noise. The source chamber 12a is used for maintaining reservoir/density of alkali-atom for optimal clock signal. The interrogation chamber 12b is used for optical pumping and signal detection.

The system 10 of FIG. 3A further includes a laser pump 14 aligned preferably perpendicular to the cell window faces 12 right below the interrogation chamber 12b to emit laser beam into the interrogation cell 12b. Depending on the particular embodiment, a DC magnetic bias field is also applied parallel to the laser field, to define system access and to split the Zeeman sub-levels.

As the alkali-atoms are operating within a buffer-gas environment, the laser pump needs a linewidth only less than the Doppler broadened line width (i.e., ~350 MHz). Therefore, intensity modulated or DC-biased vertical cavity self-emitting laser (VCSEL) pump is a suitable optical pump, without needing extreme optical line narrowing. Choice of modulation or DC bias depends on specific embodiment of alkali-interrogation. As well, VCSEL pumping reduces overall power consumption as the threshold is sub-milliamps (known in the field). A zero-light-shift servo controlled heater 15 is positioned very close to the laser 14, preferably at the junction of the laser 14, as shown in FIG. 3A, to control the temperature of the laser 14 in order to maintain the emission wavelength at optical frequency of zero light shift. This heater may consist of one or two independent heaters. In one embodiment, to detect and feedback-lock against light-shifts, the VCSEL is intentionally intensity modulated, with this modulation directly measured as a modulation on the optical clock signal, which provides an error signal via feedback loop to the heater 15 as illustrated in FIG. 3A. The heater 15 in turn maintains the VCSEL temperature at a point where the laser optical frequency is at the zero-light-shift point (VCSEL frequency is tuned with temperature). Second integrated heater is used to prevent frequency shifts during intensity-modulation, an effect known with semiconductor laser devices.

It is noted that by modulating VCSEL drive current for light-shift locking, as discussed above, also causes unwanted VCSEL frequency shifts. The heater 15 onto the VCSEL die 14 can allow for rapid temperature-induced changes to VCSEL wavelength to compensate for current-modulated changes to wavelength. If modulation rates higher than 0.1 Hz are needed, localized heating via another heater (not shown) can be integrated into the VCEL structure 14 to speed the response. Since this heater is very small and close to the junction, it will have a thermal response time close to that of the junction itself. Transient thermal analysis of a VCSEL 14 with an integrated heater near the junction shows a heater response time on the order of 100 us, only a factor often slower than the laser junction itself. This shows that the VCSEL 14 can be modulated at 500 Hz with extremely stable wavelength if feedback is applied to the small local integrated heater.

It is known in the art that the atoms also react to a change in pressure in the cell 12, which perturbs the transition frequency of the atoms, causing a change or a shift in the clock frequency. The change in the buffer-gas pressure in the cell is generally brought by a change in the volume of the cell chamber 12 with a fixed number of gas molecules and/or by the change in the amount of gas (buffer gas atoms) within a fixed volume. This change in pressure is brought by a pressure modulator 18 which in this embodiment is incorporated in the source chamber 12a of the system 10 as shown in FIG. 3A. The pressure modulator 18 modulates pressure either by volume modulation or via gas pump, pumping buffer gas into and out of a "ballast" chamber, to modulate the buffer gas atoms within the fixed volume. In the preferred embodiment, the pressure is modulated by 1% to 50%, preferably in the range of 1%-10% at a frequency of preferably about 1 Hz. The system also includes a zero-pressure-shift feedback controlled heater 17 positioned at the interrogation chamber 12b and an alkali density feedback heater 19 incorporated into the source chamber 12a to maintain constant alkali vapor density. In order to minimize thermal power dissipation, all components of the system 10 are preferably packaged within a vacuum housing (not shown). Further, to minimize power consumption, the dimensions of the individual chambers is small (millimeter-scale) preferably in the range of 1 mm to 10 mm to reduce radiative power loss, thus reducing the consumption power to preferably about 10 mW. The integration of the pressure modulator with alkali vapor cell, allows for a chip-scale primary frequency standard with use of a vapor-pressure cell as will be described in greater detail below.

The pressure modulator 18 functions to modulate the pressure of the buffer gas in the chamber 12 by changing the volume of the chamber 12a. This is accomplished via several means, such as piston, plunger, bellows and like as will be described in greater detail below. Clearly, decrease in volume of the chamber 12a will increase the pressure of the buffer gas atoms in the cell 12 and vice versa. Assuming that the buffer-gas mixture is not precisely at the zero-pressure-shift point, this change in pressure of the buffer gas atoms or mixture will perturb the alkali-atom hyperfine transition 13 in the chamber 12 which causes a shift in clock frequency. In this manner, the alkali atoms function as a "pressure sensor". The shift in clock frequency is measured via the detector 16, preferably a "lock-in" detector, which generates an error signal that sweeps back and forth from a negative signal to zero signal to positive signal upon modulation of the buffer-gas pressure. This error signal is used within a feedback to control heater 17 incorporated at the interrogation chamber 12b as illustrated in FIG. 3, driving the system to the zero-pressure-point. This feedback of the error signal to the heater 17 will instigate the heater 17 to control the temperature in the interrogation chamber 12b in order to allow for precise setting of the interrogation chamber 12b at the temperature for zero buffer-gas pressure shifts. Such a point resides on a zero-crossing of the error signal, allowing for feedback control of zero-pressure shift.

Alternatively, the pressure modulator 18 may function to modulate the pressure in the chamber 12 with a fixed volume by changing the buffer-gas density by, for example, a gas pump, pumping gas between a ballast and interrogation chamber. Clearly, the increase in the number of buffer-gas atoms will increase the pressure and vice versa. Thus, the gas pump modulates the buffer-gas pressure, which in-turn causes a modulation on the clock frequency through interaction with the alkali-atom-vapor. In a similar fashion as discussed above, the induced pressure modulation will be detected within the lock-in error signal, which is fed-back to the zero-pressure shift feedback controlled heater 17 in the interrogation chamber 12b to maintain this interrogation temperature at the point of zero-pressure-shift.

Furthermore, it is desired to maintain constant alkali-atom density to minimize alkali-alkali shifts. Measuring the VCSEL DC photodetector signal of the laser 14 via the photodetector 16 provides a measure of optical depth and of alkali-density. This DC signal can be used in a simple feedback to the alkali density feedback heater 19 to maintain the temperature of the source chamber 12a, therefore maintaining constant alkali-density.

FIG. 3B illustrates a schematic of an integrated system 20 for providing a chip-scale primary frequency standard in accordance with another embodiment of the present invention. The system 20 of FIG. 3B is similar to FIG. 3A except the alkali vapor cell 12 comprises a third chamber 12c. In this embodiment, the atom source and the pressure modulator are separated. The pressure modulator 18 in this case is a gas-pump, preferably a MEMs based gas pump. Note that the zero pressure-shift servo controlled heater 17 is still on the interrogation chamber 12c as illustrated in FIG. 3B. One of the advantages of having the third chamber 12c is to pump the gas in and out of the chamber 12c preferably via the MEMs gas pump into the interrogation chamber 12b. This allows for continuous, 0.1 Hz to 1 Hz, buffer-gas modulation used for clock error-signal generation, with feedback control to maintain the interrogation chamber temperature at the zero pressure-shift point via the zero-pressure-shift servo controlled heater 17.

Further, as discussed above, in a similar fashion to feedback control of locking the clock at the zero pressure-shift point, modulating the intensity of the laser will produce a clock frequency error-signal from which another feedback control can be used to stabilize the laser optical frequency at the zero light-shift frequency.

In one embodiment, known micro-electro-mechanical systems such as a plunger, piston, bellows or MEMs snap-switch transducer or like are utilized as the pressure modulator 18 for modulation of the inherent buffer gas pressure (or density), used within a feedback loop to maintain the buffer-gas mixture at the point of zero pressure shifts. The transducers are generally made of silicon and are anodically bonded to chip-scale alkali-cell structures for miniaturized integration. A transducer 18, for example, moves in (compress) and out (expand) of the cell 12. This movement of the transducer can be caused by an actuator such as electrostatic charges, piezoelectric actuator, a solenoid actuator, miniature shape memory alloy linear actuator or like known in the art. The transducer 18 preferably moves slow enough to not cause much of a temperature change in the buffer-gas mixture (adiabatic regime). This compression and expansion causes a change in the volume (with fixed number of gas molecules) which in turn causes a change in pressure of the density of the buffer gas. As discussed above, volume displacement of about 1% to 10% is feasible and strong enough to allow an error signal for feedback control.

Figure 4:
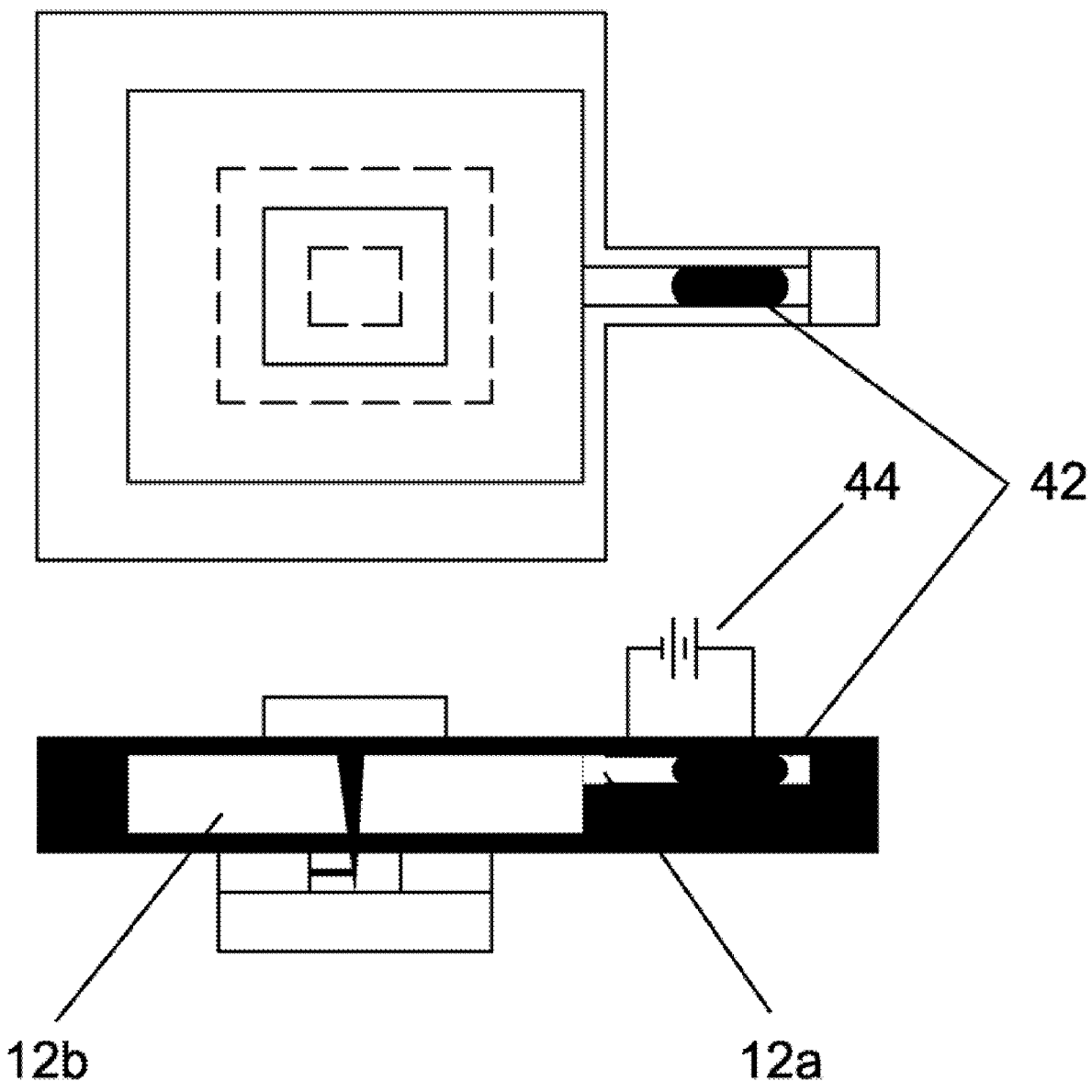
FIG 4 illustrates a schematic of an integrated system for providing a chip-scale primary frequency standard in accordance with a preferred embodiment of the present invention.

In another embodiment, the pressure modulator 18 is a liquid-metal piston with an alkali metal plug, a.k.a. alkali piston 42 as illustrated in the system 40 of FIG. 4. The system 40 functions similar to the system 10 as described above with alkali piston 42 as a pressure modulator 18. This would function as a combined source pressure modulator such that the alkali metal plug or piston 40 is inserted in micro-channel of the cell 12 while the piston also functions to module the pressure. This alkali piston 42 shown in FIG. 4 is attached to the interrogation chamber 12b of the cell 12. The piston 42 is actuated preferably by a known technique, electrowetting, which is the change in the three-phase (alkali metal, gas, microchannel wall) contact angle with applied voltage. The change in contact angle generates a pressure differential across the alkali metal/gas interface that moves the alkali piston 40 in the microchannel of the cell 12. The electrowetting is controlled by electrodes 44 placed in the microchannel structure of the cell 12 as shown in FIG. 4. Such an alkalimetal piston can also be used as reservoir of alkali metal. Alternatively, the alkali piston 42 can be actuated by thermocapillary transport.

In yet another embodiment, as discussed above, the pressure modulator 18 is a gas pump, preferably a MEMs pump which pumps gas between a ballast and interrogation chamber, thus changing buffer-gas density in a fixed volume. The MEMs pump modulates the buffer-gas pressure, which in turn causes a modulation on the clock frequency through interaction with the alkali-atom vapor. The lock-in detected error signal is fed-back to the zero-pressure-shift servo controlled heater 17 (a.k.a. interrogation chamber heater) to maintain this interrogation temperature at the point of zero-pressure shift.

Some of the few advantages of implementing such a feedback scheme to create a primary standard from vapor-cell technology include simpler use of laser diodes and laser locking systems compared to alkali-beam or trapped-atom or trapped ion clocks. Buffer-gas pressure allows for diffusion limited alkali velocities and Doppler-broadened optical absorption profile, and hence relatively wide linewidth laser diodes (including low power consumption VCSEL lasers) can be used for optical pumping. As the natural alkali linewidth is only ~5 MHz, traditional optically-interrogated primary standards need to utilize more complicated and power consuming narrow-line width lasers, such as DFB (distributed feedback) or external-cavity lasers, both of which are larger and consume much more power than VCSEL laser (~30 mA compared to sub-mA thresholds). With use of Doppler broadened alkali optical absorption band (~400 MHz), low power VCSEL lasers with ~30 MHz linewidth can be implemented. Also, alkali interrogation occurs continuously, not periodically. This reduces complications revolving around the need for a precision local oscillator flywheel as is the case with trapped atom/trapped ion schemes. In a sense, continuous interrogation allows system to be implemented with typical quartz local oscillators, disciplining the LO to the atomic resonance.

This novel approach of feedback control of the present invention as described above provides for maintaining the zero-pressure frequency for a long-term cell stable clock without being effected by cell aging and cell darkening. If the cell buffer-gas change with time (helium diffusion or gas outgassing, for example) the set-point temperature is actively adjusted to maintain the system at the zero-pressure-shift point, allowing for long-term stable clock frequency output; i.e. no clock drift with time. The novel system of the present invention also provides oscillation at the 0-0 free-atom hyperfine frequency without system calibration. Such a system would allow for active compensation of manufacturing errors on clock fabrication. An additional benefit of this novel approach to laser wavelength stabilization by intensity modulation is the minimization of FM-to-AM noise that is incurred in FM wavelength dither schemes, enhancing the stability of the system. Thus, by disciplining the cell to the free atom frequency, the system provides a compact, affordable, primary frequency references of unprecedented stability, accuracy, size, weight and power.

Atomic clocks according to one or more aspects of the present invention may also be well suited for facilitating use of time-ordered encryption keys with portable and lightweight secure communications gear (i.e., transceivers) and rapid Global Positioning System (GPS) signal acquisition gear (i.e., receivers), by way of further non-limiting example only. Regardless, such a clock will have broad applicability and usefulness. The cell may of course have other uses as well, such as for use with magnetometers, gyroscopy and other physical instrumentation. Note that cheap or cheaper primary frequency standards could be used within pico-satallites to configurate GPS satellites, for hand-held receivers within "Global Positioning (GPS)-denied" environments, for applications where one can not re-sync the clock very often, so need a long-term stable system (GPS-denied arenas). This would enable to provide accuracy in time and frequency for both GPS systems and "GPS-denied" systems.

It will be apparent to those skilled in the art that various modifications and variations may be made in the apparatus and process of the present invention without departing from the spirit or scope of the invention. Thus, it is intended that the present invention cover the modification and variations of this invention provided they come within the scope of the appended claims and their equivalents.

The invention claimed is:

1. An integrated system for providing a chip-scale primary frequency standard, the system comprising:
   an alkali vapor cell comprising at least two chambers having a common buffer-gas, wherein said buffer-gas nominally of the zero-pressure-shift mixture;
   a heating element bonded to the alkali vapor cell;
   a pressure modulator bonded to the alkali vapor cell to modulate pressure in the alkali vapor cell causing a change in frequency shift; and
   a feedback control loop for detecting the change in frequency shift in the alkali vapor cell and providing a signal to the heating element to modify temperature of the alkali vapor cell to compensate for the change in frequency shift so as to maintain the buffer-gas mixture at a zero pressure-shift point.

2. The system of claim 1 wherein said pressure modulator is a micro-electro-mechanical element for modulating the pressure by changing volume of the cell.

3. The system of claim 1 wherein said pressure modulator is a liquid metal piston for modulating the pressure by changing volume of the cell.

4. The system of claim 3 wherein said liquid metal piston is an alkali piston, wherein said piston functions to provide the alkali metal into the cell and to modulate the pressure in the cell.

5. The system of claim 1 wherein said pressure modulator is MEMs pump for modulating the pressure by changing amount of the buffer gas in the cell.

6. The system of claim 1 wherein said one of the two chambers having temperature different than the other of the two chambers.

7. The system of claim 1 wherein said first chamber is an alkali source chamber and the second chamber is an interrogation chamber.

8. The system of claim 7 wherein said cell comprising a third chamber, wherein said pressure modulator and the heating element are bonded to said third chamber.

9. The system of claim 7 wherein the source chamber has a temperature lower than the interrogation chamber.

10. The system of claim 7 further comprising a laser aligned to the second chamber for emitting laser beam into the cell.

11. The system of claim 7 further comprising a second heating element integrated to the laser pump to maintain optical frequency when said laser is intensity modulated.

12. The system of claim 7 further comprising a second heating element integrated on the source chamber wherein DC photodetector signal is used in feedback to maintain constant optical absorption and constant alkali density.

13. The system of claim 1 further comprising a lock-in detector for detecting the change in frequency shift due to the change in the pressure in the cell.

14. A system comprising:
an integrated system comprising an alkali vapor cell comprising at least two chambers having a common buffer-gas, wherein said buffer-gas nominally of the zero-pressure-shift mixture; a heating element bonded to the alkali vapor cell; a pressure modulator bonded to the alkali vapor cell to modulate pressure in the alkali vapor cell causing a change in frequency shift; and a feedback control loop for detecting the change in frequency shift in the alkali vapor cell and providing a signal to the heating element to modify temperature of the alkali vapor cell to compensate for the change in frequency shift so as to maintain the buffer-gas mixture at a zero pressure-shift point;
a device having an input coupled to said integrated system and being operatively responsive to said input.

15. The system of claim 14 wherein said device comprise at least one of a global positioning system and a global positioning denied system.

* * * * *